United States Patent [19]
Ishii et al.

[11] Patent Number: 6,107,128
[45] Date of Patent: Aug. 22, 2000

[54] SEMICONDUCTOR DEVICE AND METHOD OF MANUFACTURING THE SAME

[75] Inventors: Kazutoshi Ishii; Sumitaka Gotou; Yasuhiro Moya; Tatsuya Kitta; Yoshihide Kanakubo, all of Chiba, Japan

[73] Assignee: Seiko Instruments Inc., Japan

[21] Appl. No.: 09/324,693

[22] Filed: Jun. 2, 1999

[30] Foreign Application Priority Data

Jun. 2, 1998 [JP] Japan .................................. 10-153376

[51] Int. Cl.[7] .............................................. H01L 21/8238
[52] U.S. Cl. ........................ 438/225; 438/218; 438/231; 438/232; 438/233; 257/274; 257/338; 257/369
[58] Field of Search ..................................... 438/199, 218, 438/219, 220, 225, 229, 230, 231, 232, 233; 257/274, 338, 369

[56] References Cited

U.S. PATENT DOCUMENTS

| | | |
|---|---|---|
| 4,282,647 | 8/1981 | Richman . |
| 5,438,005 | 8/1995 | Jang . |
| 5,494,851 | 2/1996 | Lee et al. . |
| 5,556,798 | 9/1996 | Hong . |
| 5,880,502 | 3/1999 | Lee et al. .............................. 257/372 |

*Primary Examiner*—Wael Fahmy
*Assistant Examiner*—Long Pham
*Attorney, Agent, or Firm*—Adams & Wilks

[57] ABSTRACT

Since a field effect MOS transistor can be formed with a reduced number of manufacturing processes, a semiconductor integrated circuit device can be materialized at a low cost. A semiconductor device has a structure in which a gate electrode is provided in the vicinity of the surface of a semiconductor substrate through a gate insulating film, a second conductive type heavily doped impurity region is provided in a region adjacent to a part of the gate electrode through a part of the gate insulating film and a part of a thick oxide film, another second conductive type heavily doped impurity region is provided in a region adjacent to an opposite part of the gate electrode opposing the part of the gate electrode through the part of the gate insulating film and a part of another thick oxide film, and a first conductive type heavily doped impurity region for device isolation is provided so as to surround the gate electrode and the second conductive type heavily doped impurity regions.

6 Claims, 4 Drawing Sheets

SEMICONDUCTOR DEVICE AND METHOD OF MANUFACTURING THE SAME

BACKGROUND OF THE INVENTION

The present invention relates to a semiconductor integrated circuit device. Particularly, the present invention is effective in a semiconductor integrated circuit device such as for liquid crystal for a liquid crystal display panel, for a thermal head printer, and for a quartz clock.

The present invention relates to a semiconductor integrated circuit of an insulated gate field effect type and a method of manufacturing thereof. More particularly, the present invention relates to an IC such as a driver IC for driving liquid crystal, for driving a resistor for heat sensitive paper, and the like, and an IC for a quartz clock and the like.

In a conventional N type semiconductor device indicated in FIG. 2 (a plane view), a gate electrode 7 is provided in the vicinity of the surface of a P type semiconductor substrate 1 through a gate insulating film. An N type drain region 4 is provided in a region adjacent to a part of the gate electrode 7 in the vicinity of the surface of the P type semiconductor substrate 1 through a part of the gate insulating film. An N type source region 3 is provided in a region adjacent to a part of the gate electrode 7 opposing the part of the gate electrode 7 through the part of the gate insulating film. A P type high doped impurity region 9 for earthing to the substrate is provided near the surface of the P type semiconductor substrate 1 apart from N type source 3 and drain region 4. A P type lightly doped impurity region 17 for device isolation surrounding a gate electrode (channel region) sandwiched between the N type drain region 4 and the N type source region 3 and surrounding the N type drain region 4 and the N type source region 3 is provided. And a thick oxide film for device isolation is provided an the P type lightly doped impurity region 17 for device isolation.

Further, in a conventional P type semiconductor device, an N type lightly doped impurity diffusion region 2 is provided in the vicinity of the surface of a P type semiconductor substrate 1. A gate electrode 7 is provided in the vicinity of the surface of the N type lightly doped impurity diffusion region 2 through a gate insulating film. A P type drain region 6 is provided in a region adjacent to a part of the gate electrode 7 in the vicinity of the surface of the N type lightly doped impurity diffusion region 2 through a part of the gate insulating film. A P type source region 5 is provided in a region adjacent to a part of the gate electrode 7 opposing the part of the gate electrode 7 through the part of the gate insulating film. An N type lightly doped impurity region 2 for device isolation surrounding a gate electrode 7 sandwiched between the P type drain region 6 and the P type source region 5 and the P type drain region 6 and the P type source region 5 is provided. A N type highly doped impurity region 10 for earthing the voltage is provided on the surface near the N type lightly doped region 2. And a thick oxide film for device isolation is provided on the N type lightly doped impurity region 2 for device isolation.

Further, in a conventional method of manufacturing a semiconductor integrated circuit device (not shown in Fig.), a plurality of CMOS field effect transistors are integrated by a step of forming an N type lightly doped diffusion region in the vicinity of the surface of a P type semiconductor substrate by lithography and ion implantation and thermal diffusion, a step of forming a thick oxide film for device isolation and a lightly doped impurity region for device isolation by LOCOS, a step of forming a gate oxide film in the vicinity of the surface of an active region of the P type semiconductor substrate and of the N type lightly doped diffusion region, depositing polysilicon, implanting impurity, and selectively etching and removing the impurity to form a gate electrode and polysilicon wirings, a step of forming an N type drain region and an N type source region in a self-aligning manner with respect to the gate electrode by lithography and ion implantation, a step of forming a P type drain region and a P type source region in a self-aligning manner with respect to the gate electrode by lithography and ion implantation, and a step of depositing an interlayer insulating film, selectively etching and removing the interlayer insulating film by lithography to form a contact hole for metal wirings, physically forming a metal film, selectively etching and removing the metal film by lithography to form metal wirings, depositing an insulating film, and selectively etching and removing the insulating film by lithography to form a protective film.

In the conventional semiconductor device, since the number of the required steps is large, there is a problem that the manufacturing cost is high and the cost of the chip can not be lowered.

SUMMARY OF THE INVENTION

In order to solve the above-mentioned problem, the present invention uses the following means.

A first gate electrode is provided in the vicinity of the surface of a second conductive type semiconductor substrate through a first gate insulating film, a first, second conductive type heavily doped impurity region is provided in a region adjacent to a part of the first gate electrode in the vicinity of the surface of the first conductive type semiconductor substrate through a part of the first gate insulating film and a part of a first thick oxide film, a second, second conductive type heavily doped impurity region is provided in a region adjacent to a part of the first gate electrode opposing the part of the first gate electrode through the part of the first gate insulating film and a part of a second thick oxide film, and a second conductive type heavily doped impurity region for device isolation is provided so as to surround the first gate electrode and the first, second conductive type heavily doped impurity region and the second, second conductive type heavily doped impurity region.

Further, a second conductive type lightly doped impurity diffusion region is provided in the vicinity of the surface of a second conductive type semiconductor substrate, a second gate electrode is provided in the vicinity of the surface of the second conductive type lightly doped impurity diffusion region through a second gate insulating film, a first, first conductive type heavily doped impurity region is provided in a region adjacent to a part of the second gate electrode in the vicinity of the surface of the second conductive type lightly doped impurity region through a part of the second gate insulating film, and a second, first conductive type heavily doped impurity region is provided in a region adjacent to a part of the second gate electrode opposing the part of the second gate electrode through the part of the second gate insulating film, and a second conductive type heavily doped impurity region for device isolation is provided so as to surround the second gate electrode and the first, first conductive type heavily doped impurity region and the second, first conductive type heavily doped impurity region.

Further, the first conductive type semiconductor device and the second conductive type semiconductor device are provided on one semiconductor substrate. Further, the first gate insulating film and the second gate insulating film are provided at the film thickness within the range of 10 nm to 100 nm.

Further, the first thick oxide film and the second thick oxide film are provided at the film thickness within the range of 40 nm to 500 nm.

Further, a first, second conductive type lightly doped impurity region and a second, second conductive type lightly doped impurity region are provided around the first, second conductive type heavily doped impurity region and the second, second conductive type heavily doped impurity region, respectively.

Further, the second conductive type lightly doped impurity region is provided around the second conductive type heavily doped impurity region for device isolation.

Further, a spacer is provided through the second gate insulating film outside the outer peripheral portion of the first, first conductive type heavily doped impurity region and the second, first conductive type heavily doped impurity region.

Further, a spacer is provided through an insulating film outside the outer peripheral portion of the first conductive type heavily doped impurity region for device isolation.

Furthermore, in a method of manufacturing a semiconductor integrated circuit device, a plurality of CMOS field effect transistors are integrated by a first step of forming the second conductive type lightly doped diffusion region in the vicinity of the surface of the first conductive type semiconductor substrate by lithography and ion implantation and thermal diffusion, a second step of forming a gate oxide film in the vicinity of the surface of the first conductive type semiconductor substrate and the second conductive type lightly doped diffusion region, depositing polysilicon thereon, implanting impurity, an then selectively carrying out etching for removal to form a gate electrode and polysilicon wirings, a third step of forming in a self-aligning manner a second conductive type heavily doped impurity region and a second conductive type heavily doped impurity region for device isolation with respect to the gate electrode by lithography and ion implantation, a fourth step of selectively forming a thick oxide film on the second conductive type heavily doped impurity region and the outer peripheral portion of the second conductive type heavily doped impurity region for device isolation and of the gate electrode by wet oxidation at a low temperature, a fifth step of forming the first conductive type heavily doped impurity region and the first conductive type heavily doped impurity region for device isolation by ion implantation in a self-aligning manner with the thick oxide film and the gate electrode being as the mask, and a sixth step of depositing an interlayer insulating film, selectively etching and removing the interlayer insulating film by lithography to form a contact hole for metal wirings, physically forming a metal film, selectively etching and removing the metal film by lithography to form metal wirings, depositing an insulating film, and selectively etching and removing the insulating film by lithography to form a protective film.

Further, in a method of manufacturing a semiconductor device, after a first conductive type lightly doped impurity region and a first conductive type lightly doped impurity region for device isolation are formed by ion implantation and thermal diffusion in a self-aligning manner with the thick oxide film and the gate electrode being as the mask, the first conductive type heavily doped impurity region and the first conductive type heavily doped impurity region for device isolation are formed by ion implantation in a self-aligning manner with the thick oxide film and the gate electrode being as the mask.

Further, in a method of manufacturing a semiconductor device, after the thick oxide film is selectively formed, the concentration distribution of the second conductive type heavily doped impurity region and the second conductive type heavily doped impurity region for device isolation is formed gently by thermal diffusion.

Further, in a method of manufacturing a semiconductor device, when the second conductive type heavily doped impurity region and the second conductive type heavily doped impurity region for device isolation are formed in a self-aligning manner with respect to the gate electrode by lithography and ion implantation, the second conductive type heavily doped impurity region and the second conductive type heavily doped impurity region for device isolation, and, a second conductive type lightly doped impurity region and a second conductive type lightly doped impurity region for device isolation are formed by ion implantation of two kinds of dopants having different diffusion coefficients.

Further, in a method of manufacturing a semiconductor device, after the first conductive type impurity region is formed in the vicinity of the surface of the first conductive type semiconductor substrate and of the second conductive type lightly doped impurity diffusion region in a self-aligning manner with respect to the gate electrode by ion implantation, the second conductive type heavily doped impurity region and the second conductive type heavily doped impurity region for device isolation are selectively formed in a self-aligning manner with respect to the gate electrode by lithography and ion implantation.

DETAILED DESCRIPTION OF THE INVENTION

Hereinafter, an embodiment of the present invention will be described with reference to the drawings.

In a semiconductor device according to the present invention, since a manufacturing method which makes it possible to remarkably reduce many operations necessary in a lithography process is used, great reduction in the manufacturing processes can be materialized.

Figure 1:
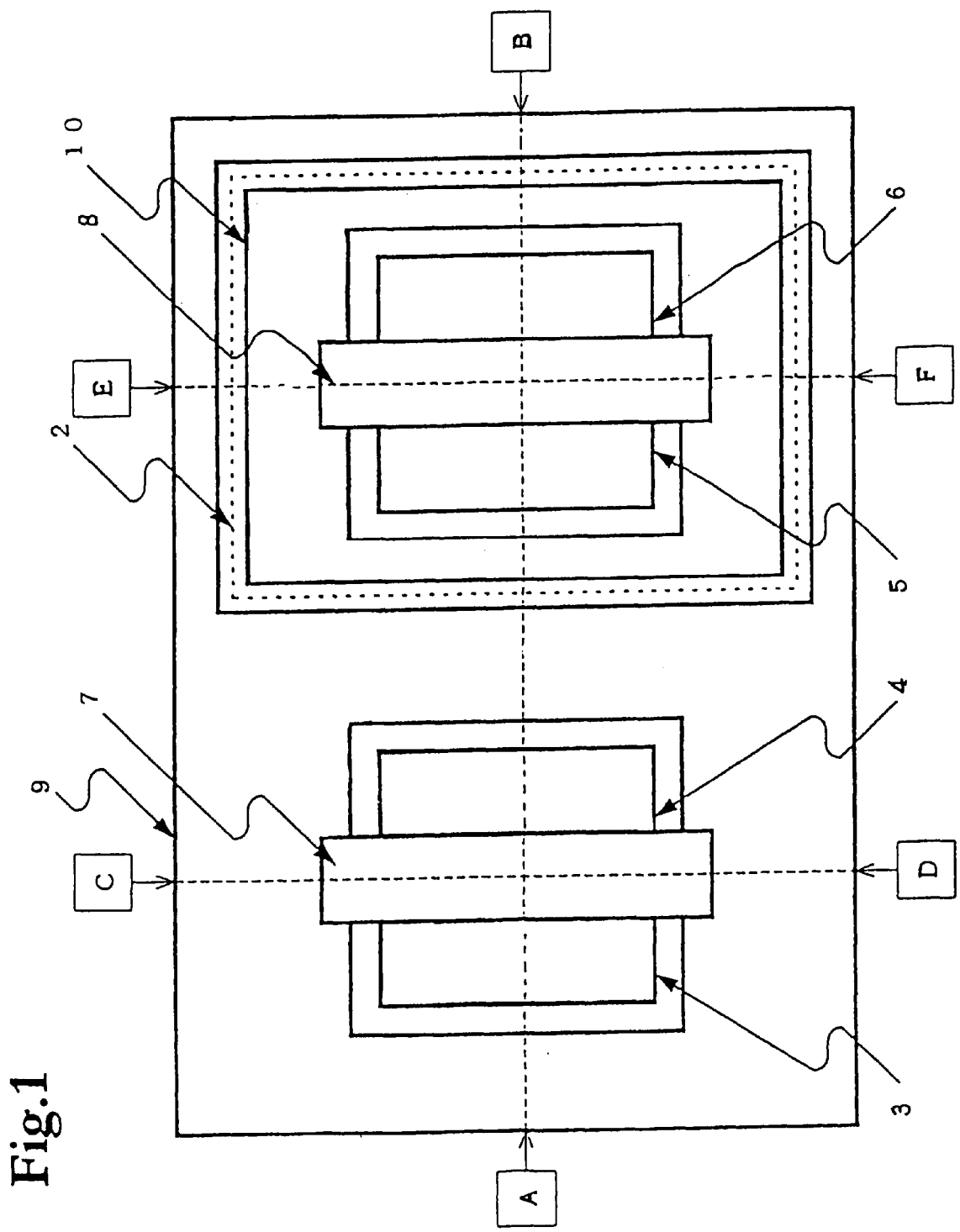
FIG. 1 is a schematic plan view of a CMOS type semiconductor device according to the present invention.
Figure 2:
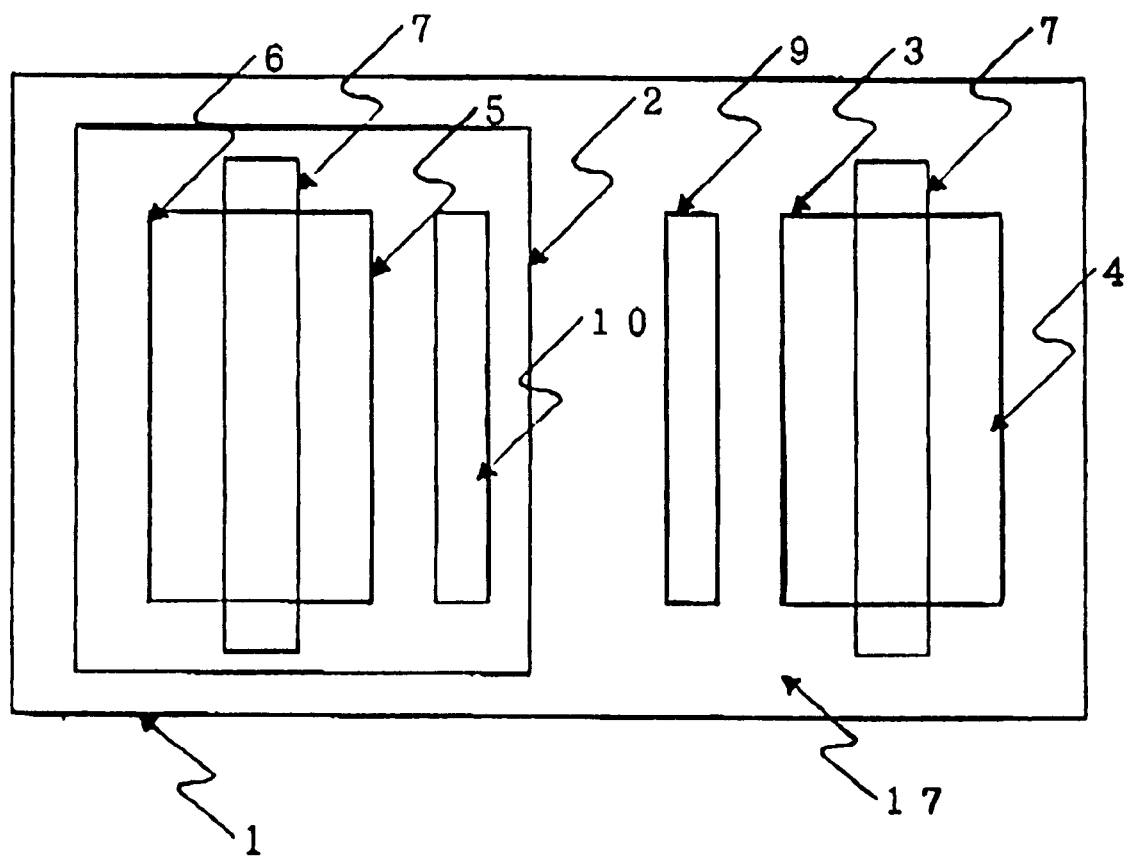
FIG. 2 is a schematic plan view of a conventional CMOS type semiconductor device.
Figure 3:
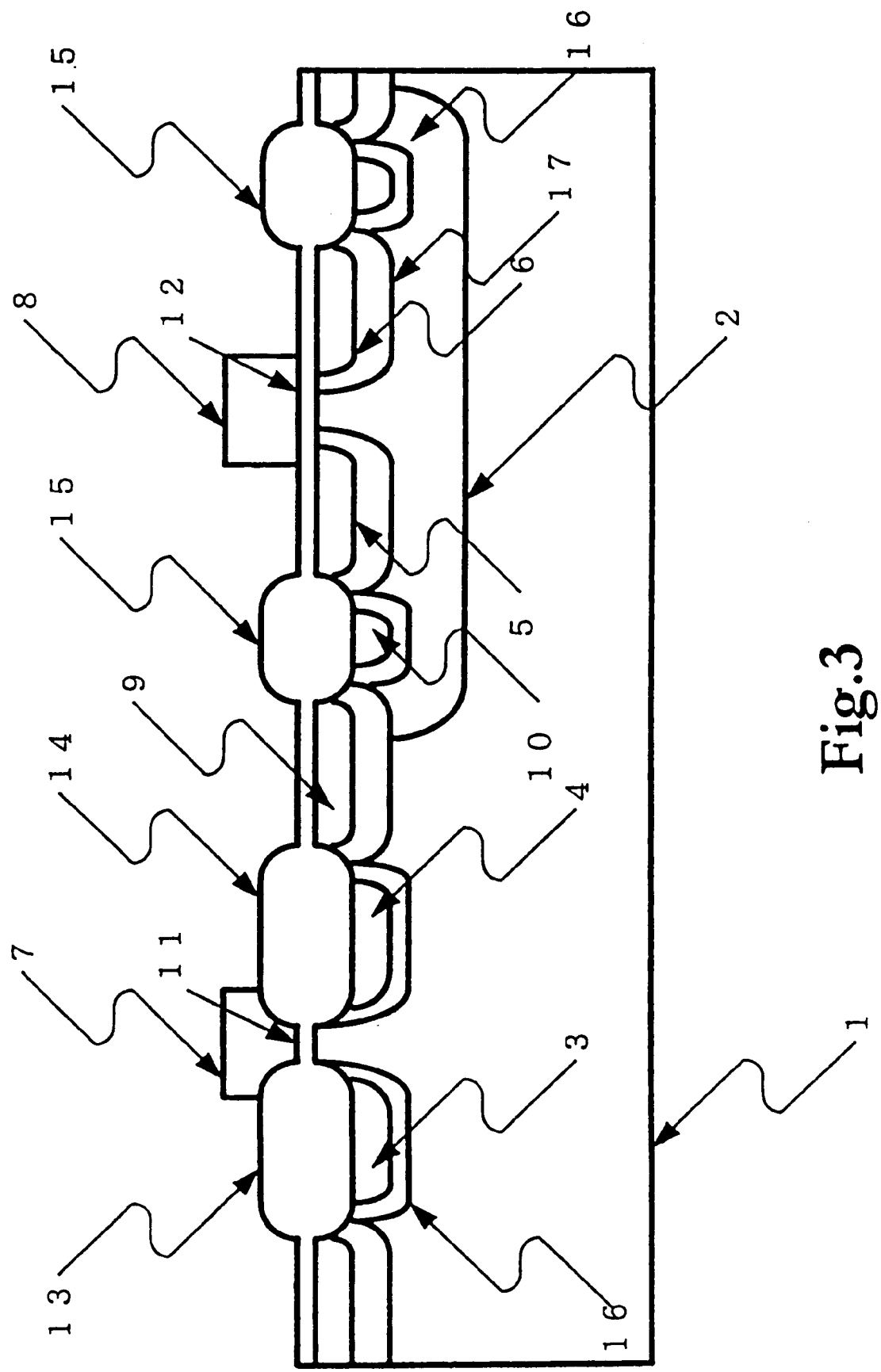
FIG. 3 is a schematic sectional view taken along the line A–B in FIG. 1 of the CMOS type semiconductor device according to the present invention.

FIG. 1 is a schematic plan view of an N channel transistor, a P channel transistor, and device isolation regions of a MOS field effect type semiconductor device according to the present invention. FIG. 3 is a schematic sectional view taken along the line A–B in FIG. 1 of the N channel transistor, the P channel transistor, and the device isolation regions of the MOS field effect type semiconductor device according to the present invention.

First, the N channel transistor and a device isolation region will be described with reference to the drawings. A gate electrode 7 of the NMOS Tr is provided in the vicinity of the surface of a P type semiconductor substrate 1 through a first gate insulating film 11. An N type source region 3 is provided in a region adjacent to a part of the gate electrode 7 in the vicinity of the surface of the P type semiconductor substrate through a part of the first gate insulating film 11 and a part of a first thick oxide film 13. An N type drain region 4 is provided in a region adjacent to a part of the first gate electrode 7 opposing the part of the first gate electrode 7 through the part of the first gate insulating film 11 and a part of a second thick oxide film 14. A P type heavily doped impurity isolation region 9 is provided so as to surround the first gate electrode 7 and the N type source region 3 and the N type drain region 4.

Here, the film thickness of the first gate insulating film 11 is, in the case where silicon oxide is used, preferably 200 nm or thinner, but it is easy to make the film thickness between 5 nm and 100 nm, and, most preferably, the film thickness is from 10 nm to 25 nm. Further, the film thickness of the first thick oxide film 13 and of the second thick oxide film 14 is preferably 1000 nm or thinner, but it is easy to make the film thickness between 100 nm and 500 nm, and, most preferably, the film thickness is from 200 nm to 400 nm.

Next, the P channel transistor and the other device isolation region will be described with reference to the drawings. A second gate electrode 8 is provided in the vicinity of the surface of an N type lightly doped impurity diffusion region 2 through a second gate insulating film 12, the N type lightly doped impurity diffusion region 2 being provided in the vicinity of the surface of the P type semiconductor substrate 1. A P type source region 5 is provided in a region adjacent to a part of the second gate electrode 8 in the vicinity of the surface of the N type lightly doped impurity diffusion region 2 through a part of the second gate insulating film 12, and a P type drain region 6 is provided in a region adjacent to a part of the second gate electrode 8 opposing the part of the second gate electrode 8 through the part of the second gate insulating film 12. An N type heavily doped impurity isolation region 10 is provided in the N type lightly doped impurity diffusion region 2 so as to surround the second gate electrode 8 and the P type source region 5 and the P type drain region 6 through a third thick oxide film 15.

Here, the film thickness of the second gate insulating film 12 is, in the case where silicon oxide is used, preferably 200 nm or thinner, but it is easy to make the film thickness between 5 nm and 100 nm, and, most preferably, the film thickness is from 10 nm to 25 nm. Further, the film thickness of the third thick oxide film 15 is preferably 1000 nm or thinner, but it is easy to make the film thickness between 100 nm and 500 nm, and, most preferably, the film thickness is from 200 nm to 400 nm.

In the case where the semiconductor integrated circuit device having the N channel transistor, the P channel transistor, and the device isolation regions of the MOS field effect type semiconductor device according to the present invention which is described heretofore is formed, power supply voltage is applied between the P type semiconductor substrate 1 and the N type lightly doped impurity diffusion region 2. In general, 5V±10%, 3V±10%, 1.5V±10% and the like are used, and further, there is also a case where 0.8V±10% is used. The semiconductor device described heretofore can be used only with low power supply voltage which equals to or is lower than the junction withstanding pressure between the N type drain region 4 and the P type heavily doped impurity isolation region 9 and which equals to or is lower than the junction withstanding pressure between the P type drain region 6 and the N type heavily doped impurity isolation region 10.

Therefore, according to the present invention, the profile of the impurity concentration is formed gently between the N type drain region 4 and the P type heavily doped impurity isolation region 9 and between the P type drain region 6 and the N type heavily doped impurity isolation region 10.

Here, to form gently the profile of the impurity concentration, there are: a method where an N type lightly doped impurity region 16 is provided so as to surround the N type drain region 4 and the N type heavily doped impurity isolation region 10; a method where a P type lightly doped impurity region 17 is provided so as to surround the P type drain 6 and the P type heavily doped impurity isolation region 9; and a method where a spacer is provided on side surfaces of the first thick oxide film 13, the second thick oxide film 14, and the third thick oxide film 15. The respective concentrations of the impurity in the N type lightly doped impurity region 16 and of the impurity in the P type lightly doped impurity region 17 are set such that the junction withstanding pressures with the impurity regions of the opposite conductive types to be junctioned therewith equal to or are higher than the power supply voltage.

Figure 4:
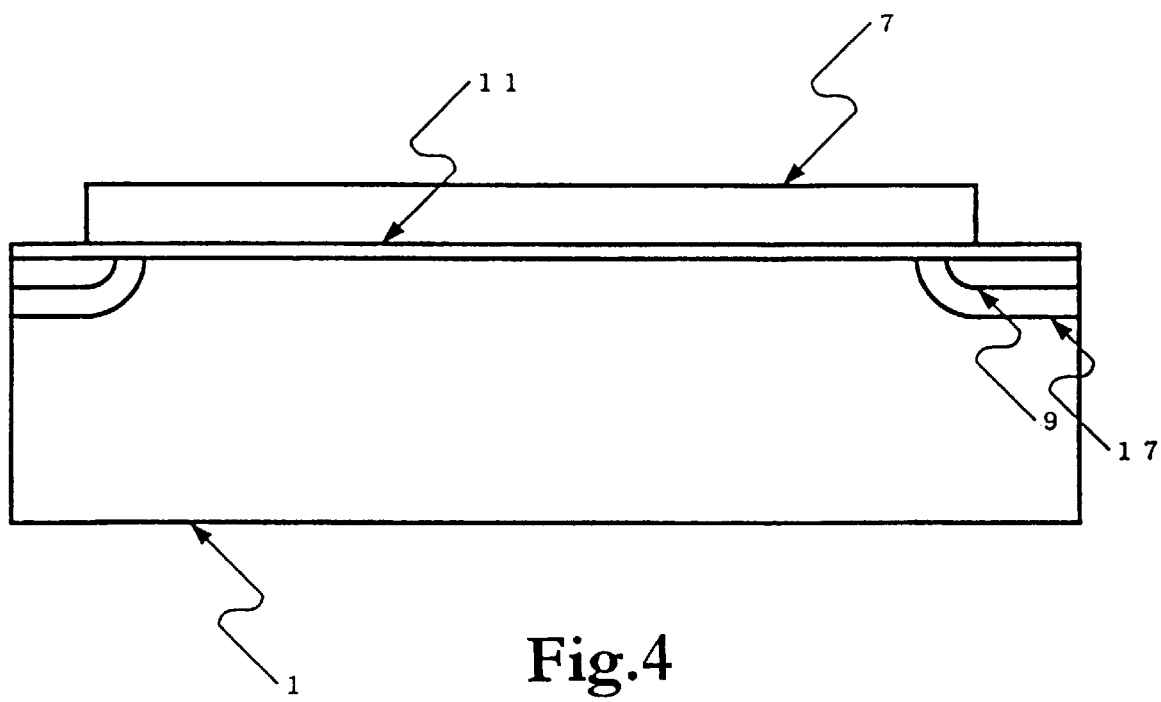
FIG. 4 is a schematic sectional view taken along the line C–D in FIG. 1 of the CMOS type semiconductor device according to the present invention.
Figure 5:
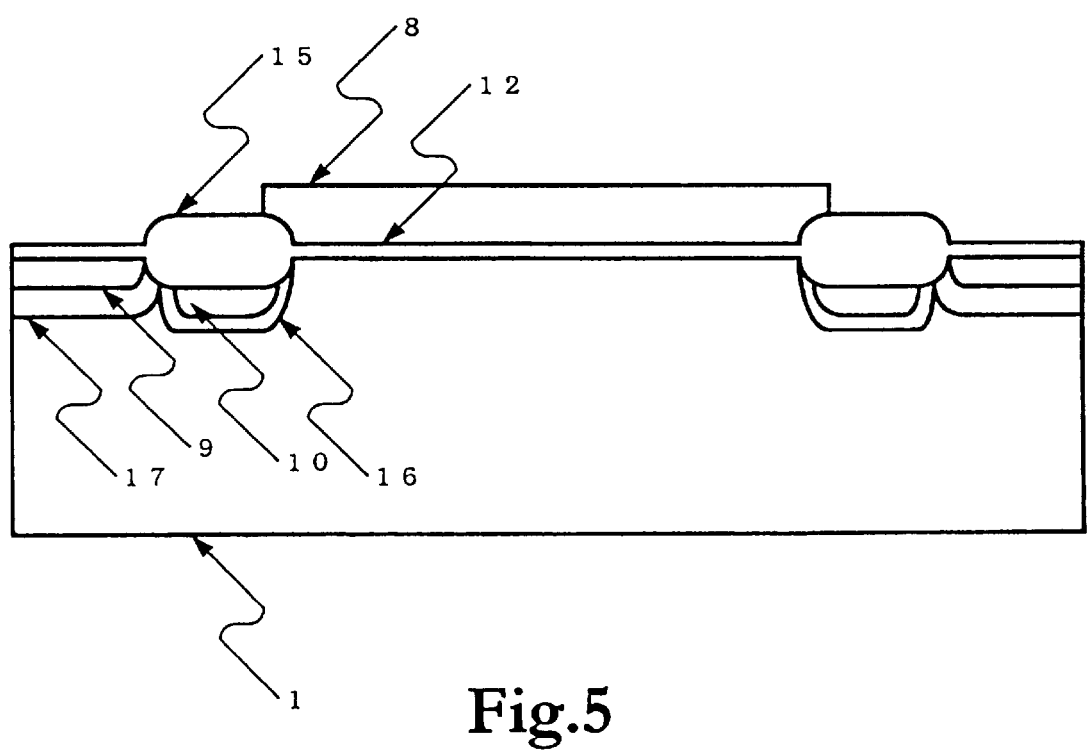
FIG. 5 is a schematic sectional view taken along the line E–F in FIG. 1 of the CMOS type semiconductor device according to the present invention.

For reference, FIG. 4 is a schematic sectional view taken along the line C–D in FIG. 1 of the N channel transistor and the device isolation region of the MOS field effect type semiconductor device according to the present invention, and FIG. 5 is a schematic sectional view taken along the line E–F in FIG. 1 of the P channel transistor and the device isolation region of the MOS field effect type semiconductor device according to the present invention.

As described in the above, according to the present invention, in a semiconductor integrated circuit device such as for liquid crystal for a liquid crystal display panel, for a thermal head printer, and for a quartz clock, since the manufacturing process can be simplified, there is an effect that the manufacturing cost can be lowered.

What is claimed is:

1. A method of manufacturing a semiconductor integrated circuit device comprising a first conductivity type semiconductor device and a second conductivity type semiconductor device formed on the same semiconductor substrate by:

a first step of forming a second conductivity type lightly doped diffusion region in the vicinity of the surface of a semiconductor substrate by lithography and ion implantation and thermal diffusion;

a second step of forming a gate oxide film in the vicinity of the surface of the semiconductor substrate and the second conductivity type lightly doped diffusion region, depositing polysilicon thereon, implanting impurity, and then selectively carrying out etching for removal to form a gate electrode and polysilicon wirings;

a third step of forming in a self-aligning manner a second conductivity type heavily doped impurity region and a second conductivity type heavily doped impurity region for device isolation with respect to the gate electrode by lithography and ion implantation;

a fourth step of selectively forming a thick oxide film on the second conductivity type heavily doped impurity region and the outer peripheral portion of the second conductivity type heavily doped impurity region for device isolation and of the gate electrode by wet oxidation at a low temperature;

a fifth step of forming a first conductivity type heavily doped impurity region and a first conductivity type heavily doped impurity region for device isolation by ion implantation in a self-aligning manner with the thick oxide film and the gate electrode being used as a mask; and a sixth step of depositing an interlayer insultating film, selectively etching and removing the interlayer insulating film by lithography to form a contact hole for metal wirings, physically forming a metal film, selectively etching and removing the metal film by lithography to form metal wirings, depositing an insultating film, and selectively etching and removing the insulating film by lithography to form a protective film.

2. A method of manufacturing a semiconductor device as claimed in claim 1; wherein after a first conductivity type lightly doped impurity region and a first conductivity type lightly doped impurity region and a first conductivity type lightly doped impurity region for device isolation are formed by ion implantation and thermal diffusion in a self-aligning manner with the thick oxide film and the gate electrode in the fifth step being used as a mask, the first conductivity type heavily doped impurity region and the first conductivity type heavily doped impurity region for device isolation are formed by ion implantation in a self-aligning manner with the thick oxide film and the gate electrode being used as a mask.

3. A method of manufacturing a semiconductor device as claimed in claim 1; wherein after the thick oxide film is selectively formed in the fourth step, the concentration distribution of the second conductivity type heavily doped impurity region for device isolation is formed gently by thermal diffusion.

4. A method of manufacturing a semiconductor device as claimed in claim 1; wherein when the second conductivity type heavily doped impurity region and the second conductivity type heavily doped impurity region for device isolation are formed in a self-aligning manner with respect to the gate electrode by lithography and ion implantation in the third step, the second conductivity type heavily doped impurity region and the second conductivity type heavily doped impurity region for device isolation, and, a second conductivity type lightly doped impurity region and a second conductivity type lightly doped impurity region for device isolation are formed by ion implantation of two kinds of dopants having different diffusion coefficients.

5. A method of manufacturing a semiconductor device as claimed in claim 1; wherein after the first conductivity type impurity region is formed in the vicinity of the surface of the semiconductor substrate and of the second conductivity type lightly doped impurity diffusion region in a self-aligning manner with respect to the gate electrode by ion implantation in the third step, the second conductivity type heavily doped impurity region and the second conductivity type heavily doped impurity region for device isolation are selectively formed in a self-aligning manner with respect to the gate electrode by lithography and ion implantation.

6. A method of manufacturing a semiconductor device according to claim 1; wherein the semiconductor substrate comprises a semiconductor substrate of the first conductivity type.

* * * * *